United States Patent
Huang et al.

(10) Patent No.: US 9,620,239 B2
(45) Date of Patent: Apr. 11, 2017

(54) MEMORY ARRAY AND OPERATION METHOD FOR MEMORY DEVICE, INCLUDING DATA INVERSION

(71) Applicant: Semiconductor Manufacturing International (Shanghai) Corporation, Shanghai (CN)

(72) Inventors: Cheng-Tai Huang, Shanghai (CN); Chia-Chi Yang, Shanghai (CN); Chen-Yi Huang, Shanghai (CN)

(73) Assignee: SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 0 days.

(21) Appl. No.: 14/670,717

(22) Filed: Mar. 27, 2015

(65) Prior Publication Data

US 2015/0318050 A1 Nov. 5, 2015

(30) Foreign Application Priority Data

Apr. 30, 2014 (CN) .......................... 2014 1 0181422

(51) Int. Cl.
*G11C 17/16* (2006.01)
*G11C 17/18* (2006.01)

(52) U.S. Cl.
CPC ............. *G11C 17/16* (2013.01); *G11C 17/18* (2013.01)

(58) Field of Classification Search
CPC ................................ G11C 17/18; G11C 17/16
See application file for complete search history.

(56) References Cited

U.S. PATENT DOCUMENTS

| 6,563,745 | B1* | 5/2003 | Ilkbahar | G11C 16/10 365/189.02 |
|---|---|---|---|---|
| 2004/0210814 | A1* | 10/2004 | Cargnoni | H03M 13/13 714/758 |
| 2011/0083057 | A1 | 4/2011 | Huang | |
| 2011/0103159 | A1* | 5/2011 | Noorlag | G11C 7/1006 365/189.011 |
| 2013/0124943 | A1* | 5/2013 | Mateescu | G06F 11/1008 714/766 |
| 2013/0275821 | A1* | 10/2013 | Braceras | G11C 29/822 714/718 |
| 2015/0194222 | A1* | 7/2015 | Kanda | G11C 17/18 365/96 |

* cited by examiner

*Primary Examiner* — J. H. Hur
(74) *Attorney, Agent, or Firm* — Anova Law Group, PLLC (57) ABSTRACT

A method for operating a memory is provided. The memory has an array of memory cells arranged in a plurality of rows and columns. Each row includes a label storage unit. The method includes receiving a first to-be-programmed data set to be stored into a target row and determining whether a condition is satisfied. When the condition is satisfied, performing a first operation on the first to-be-programmed data set to obtain a second to-be-programmed data set, programming the second to-be-programmed data set into the target row of memory cells, and setting the value of the label storage, unit to be a first labeling value. When the condition is not satisfied, performing a second operation on the first to-be-programmed data set to program the first to-be-programmed data set into the target row of memory cells, and setting the value of the label storage unit to be a second labeling value.

20 Claims, 7 Drawing Sheets

```
┌─────────────────────────────────────────────────────┐
│ Programming the first to-be-programmed data set for │──S121
│ the memory cells of the m^th row of the memory     │
│ array into the memory cells of the m^th row of the │
│ memory array                                        │
└─────────────────────────────────────────────────────┘
                        │
┌─────────────────────────────────────────────────────┐
│ Setting the labeling value of the label storage    │
│ unit corresponding to the m^th row of the memory   │──S122
│ array to be "0"                                     │
└─────────────────────────────────────────────────────┘
```

MEMORY ARRAY AND OPERATION METHOD FOR MEMORY DEVICE, INCLUDING DATA INVERSION

CROSS-REFERENCES TO RELATED APPLICATIONS

This application claims the priority of Chinese patent application No. CN201410181422.3, filed on Apr. 30, 2014, the entire content of which is incorporated herein by reference.

FIELD OF THE DISCLOSURE

The present disclosure relates to the field of semiconductor manufacturing technology and, more particularly, relates to memory array and operation method for memory device.

BACKGROUND

The development of efuse technology is based on the melting characteristics of poly-silicon fuse. The initial resistance of an efuse may be small. When a high electrical current flows through the efuse, the efuse can be melted and the resistance of the efuse multiplies. The value of the data stored in the memory cell consisting of an efuse can thus be determined by whether the efuse has been melted.

Figure 1:
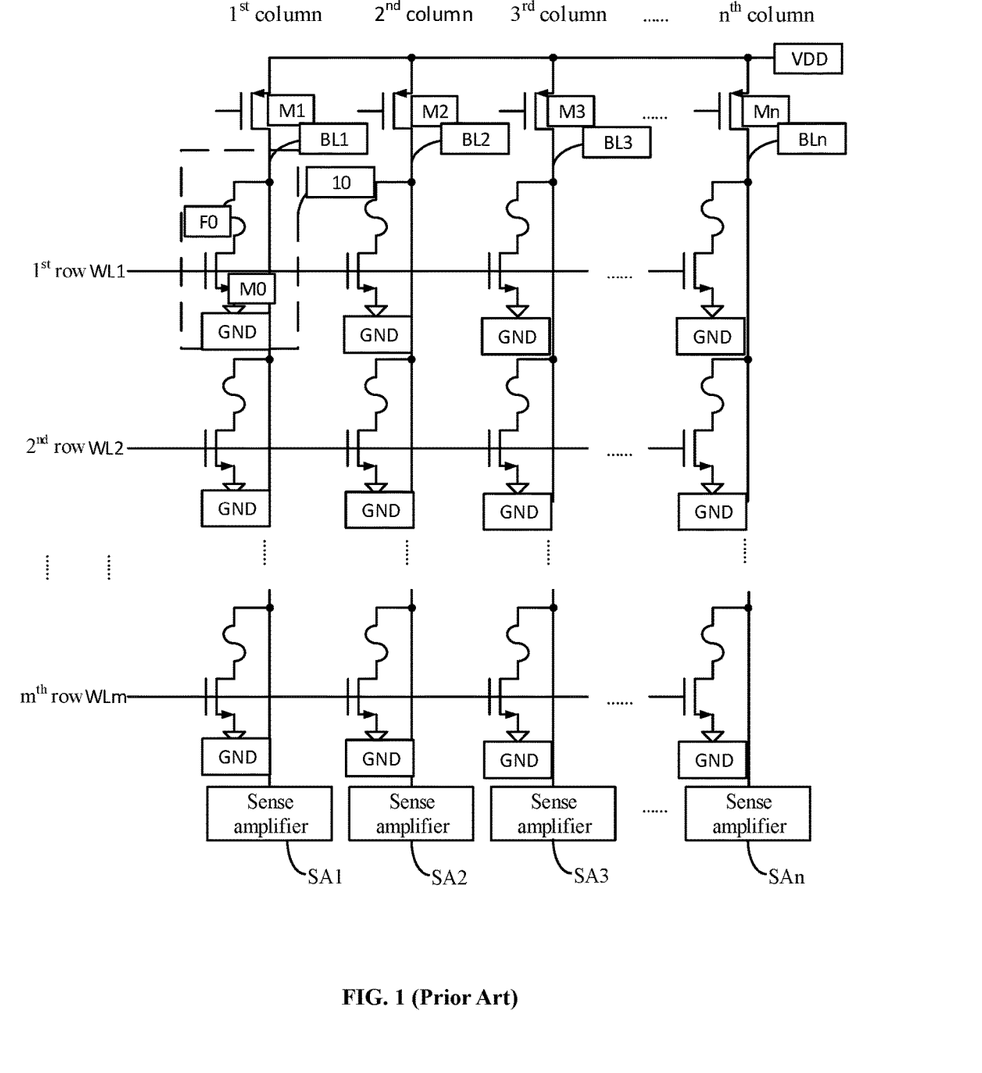
FIG. 1 illustrates structure of an existing memory device.

As shown in FIG. 1, an existing efuse memory includes m word lines, n column selection transistors, n bit lines, n sense amplifiers, and an efuse memory array. M and n are positive integers.

The m word lines include a $1^{st}$ word line (WL1), a $2^{nd}$ word line (WL2), ..., and an $m^{th}$ word line (WLm). The n column selection transistors include a $1^{st}$ column selection transistor M1, a $2^{nd}$ column selection transistor M2, a $3^{rd}$ column selection transistor M3, ..., and an $n^{th}$ column selection transistor Mn. The source of each of the n column selection transistors is connected to the power supply voltage VDD.

The n bit lines include a $1^{st}$ bit line (BL1), a $2^{nd}$ bit line (BL2), a $3^{rd}$ bit line (BL3), ..., and an $n^{th}$ bit line (BLn). Each bit line is connected to the drain of the corresponding column selection transistor. For example, the $n^{th}$ bit line (BLn) is connected to the $n^{th}$ column selection transistor.

The n sense amplifiers include a $1^{st}$ sense amplifier (SA1), a $2^{nd}$ sense amplifier (SA2), a $3^{rd}$ sense amplifier (SA3), ..., and an $n^{th}$ sense amplifier (SAn). Each sense amplifier is connected to the corresponding bit line. For example, the $n^{th}$ sense amplifier (SAn) is connected to the $n^{th}$ bit line (BLn).

The efuse memory array includes memory cells arranged in an m (row) by n (column) array. Each of the m word lines corresponds to one of the m rows of memory cells, and each of the n bit lines corresponds to one of the n columns of memory cells. That is, one word line and one bit line together correspond to one memory cell.

Each memory cell includes a row selection transistor and an efuse. The gate of the row selection transistor is connected to the word line corresponding to the memory cell. The drain of the row selection transistor is connected to a first end of the efuse. The source of the row selection transistor is connected to the ground voltage GND. A second end of the efuse is connected to the bit line corresponding to the memory cell.

For example, the memory cell 10 refers to the memory cell located at $1^{st}$ row, $1^{st}$ column), and the memory cell 10 corresponds to the $1^{st}$ world line (WL1) and the $1^{st}$ bit line (BL1). The memory cell 10 includes a row selection transistor M0 and an efuse F0. The gate of the row selection transistor M0 is connected to the $1^{st}$ world line (WL1), and the drain of the row selection transistor M0 is connected to the first end of the efuse F0. The source of the row selection transistor M0 is connected to the ground voltage GND, and the second end of the efuse F0 is connected to the $1^{st}$ bit line (BL1).

The ON/OFF state of a column selection transistor can be controlled by applying a suitable voltage on the gate of the column selection transistor. The ON/OFF state of a row selection transistor in a memory cell in a row of the memory array can be controlled by applying a suitable voltage on the corresponding word line. When the row selection transistor of a memory cell and the column selection transistor corresponding to the memory cell are both on, the efuse of the memory cell can be melted. The operation of melting an efuse of a memory cell can be known as a write operation to the memory cell. The value of the resistance of the efuse can be used to determine whether the efuse is melted. For example, when the value of the resistance is greater than a threshold value, the efuse is considered melted. When the value of the resistance is less than the threshold value, the efuse is considered not melted.

Once the efuse of a memory cell is melted, the memory cell may not be written again using the write operation. That is, the memory cell can be written only once during a programming process. Data "1" is often considered to be the data to be written into a memory cell. That is, to program the data "1" into a memory cell, the efuse of the memory cell to be written needs to be melted in order to store "1" into the memory cell. To program data "0" into a memory cell, the efuse of the memory cell for storing the data "0" needs not be melted.

However, programming failures may occur when programming memory cells. That is, the efuse may not be melted after a write operation to a memory cell, causing the data stored in the memory cell to be erroneous. Accordingly, a read operation to access the data stored may obtain the erroneous data. As a result, the production yield of the memory device may be reduced. The disclosed methods are directed to solve one or more problems set forth above.

BRIEF SUMMARY OF THE DISCLOSURE

One aspect of the present disclosure provides a method for operating a memory. The memory array has an array of memory cells arranged in a plurality of rows and a plurality of columns. Each row of memory cells including a label storage unit storing a labeling value. In the method, a first to-be-programmed data set to be stored into a target row of memory cells is received. Whether at least one programming condition on the target row of memory cells is satisfied is determined. When it is determined that the at least one programming condition on the target row of memory cells is satisfied, a first operation is performed on the first to-be-programmed data set to obtain a second to-be-programmed data set, the second to-be-programmed data set is programmed into the target row of memory cells, and the value of the label storage unit corresponding to the target row of memory cells is set to be a first labeling value. When it is determined that the at least one programming condition on the target row of memory cells is not satisfied, a second operation is performed on the first to-be-programmed data set to program the first to-be-programmed data set into the target row of memory cells, and the value of the label storage unit corresponding to the target row of memory cells is set to be a second labeling value.

Another aspect of the present disclosure provides a memory for storing M×N bits of data, where M and N are integers greater than 1. The memory has an array of M rows by (N+1) columns of memory cells, (N+1) number of data obtaining units, and N number of XOR calculators. In the memory, each memory cell of the $(N+1)^{th}$ column of each row is a label storage unit for storing a labeling value, and each data obtaining unit is connected to a corresponding column of memory cells to obtain data stored in the memory cells in the corresponding column. A first input end of each XOR calculator is connected to an output end of a corresponding data obtaining unit connected to a corresponding column of memory cells, and a second input end of each XOR calculator is connected to an output end of a data obtaining unit connected to the $(N+1)^{th}$ column of memory cells.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

Figure 2:
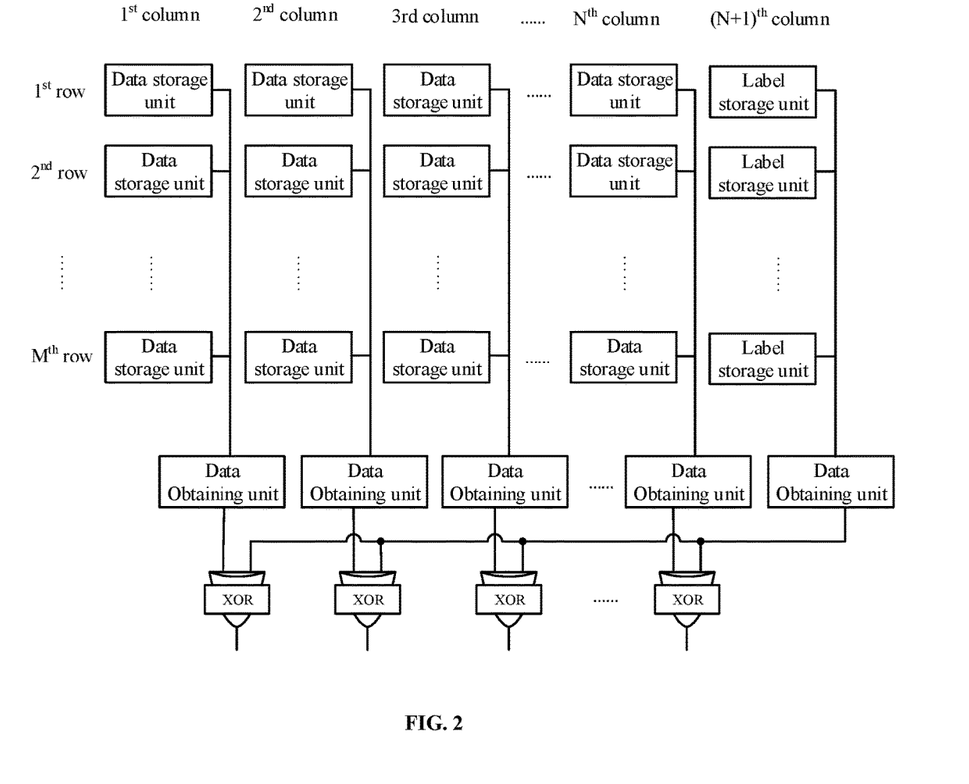
FIG. 2 illustrates structure of an exemplary memory device consistent with disclosed embodiments.

FIG. 2 illustrates structure of a memory device provided by the present disclosure. As shown in FIG. 2, the memory device may include a memory array, (N+1) data obtaining units, and N XOR calculators. The memory array may include an M (row) by (N+1) (row) array of memory cells. M and N are positive integers.

In general, a data obtaining unit, e.g., the $j^{th}$ data obtaining unit, may obtain the data stored in the memory cells ranging from the $1^{st}$ row to the $M^{th}$ row of the $j^{th}$ column, $1 \leq j \leq N+1$. The first input end of the $k^{th}$ XOR calculator may be connected to the output end of the $k^{th}$ data obtaining unit, where $1 \leq k \leq N$. The second input end of the $k^{th}$ XOR calculator may be connected to the output end of the $(N+1)^{th}$ data obtaining unit.

Further, the memory array may be an efuse memory array. The data obtaining unit may be a sense amplifier. In the memory array, the memory cells ranging from the ($1^{st}$ row, $1^{st}$ column) to the ($M^{th}$ row, $N^{th}$ column) may be data storage memory cells, i.e., data storage units. The memory cells from the $1^{st}$ row to the $M^{th}$ row of the $(N+1)^{th}$ column may be data labeling memory cells, i.e., label storage units. The data stored in a label storage unit can be a labeling data having a labeling value.

Figure 3:
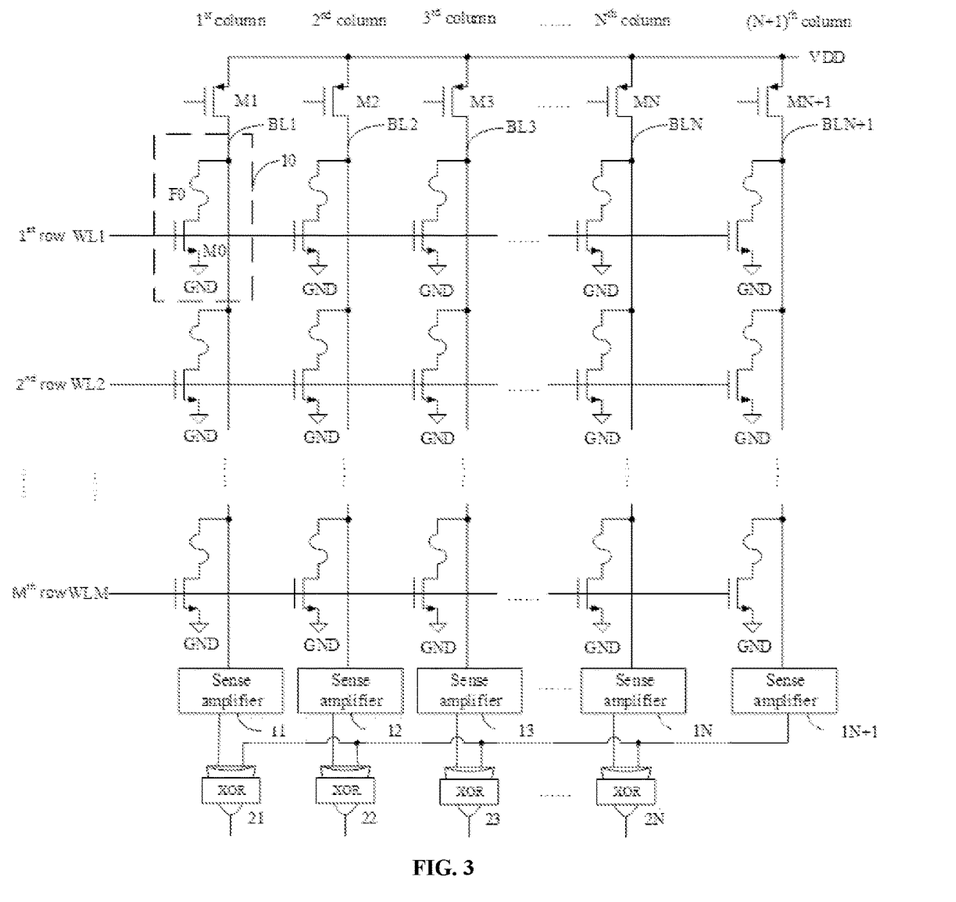
FIG. 3 illustrates structure of another exemplary memory device consistent with disclosed embodiments.

Embodiments of the present disclosure are further illustrated in FIG. 3. As shown in FIG. 3, the memory device may include an array of M (row) by (N+1) (column) memory cells, (N+1) sense amplifiers, and N XOR calculators.

The (N+1) sense amplifiers may include a $1^{st}$ sense amplifier 11, a $2^{nd}$ sense amplifier 12, a $3^{rd}$ sense amplifier 13, ..., an $N^{th}$ sense amplifier 1N, and an $(N+1)^{th}$ sense amplifier 1N+1.

The N XOR calculators may include a $1^{st}$ XOR calculator 21, a $2^{nd}$ XOR calculator 22, a $3^{rd}$ XOR calculator 23, and an $N^{th}$ XOR calculator 2N.

The first input end of the $1^{st}$ XOR calculator 21 may be connected to the output end of the $1^{st}$ sense amplifier 11, and the second input end of the $1^{st}$ XOR calculator 21 may be connected to the output end of the $(N+1)^{th}$ sense amplifier 1N+1. The first input end of the $2^{nd}$ XOR calculator 22 may be connected to the output end of the $2^{nd}$ sense amplifier 12, and the second input end of the $2^{nd}$ XOR calculator 22 may be connected to the output end of the $(N+1)^{th}$ sense amplifier 1N+1. The first input end of the $3^{rd}$ XOR calculator 23 may be connected to the output end of the $3^{rd}$ sense amplifier 13, and the second input end of the $3^{rd}$ XOR calculator 23 may be connected to the output end of the $(N+1)^{th}$ sense amplifier 1N+1. The first input end of the $N^{th}$ XOR calculator 2N may be connected to the output end of the $N^{th}$ sense amplifier 1N, and the second input end of the $N^{th}$ XOR calculator 2N may be connected to the output end of the $(N+1)^{th}$ sense amplifier 1N+1.

A memory cell may include a row selection transistor and an efuse. The drain of the row selection transistor may be connected to the first end of the efuse, and the source of the row transitory may be connected to the ground voltage GND. The memory device may further include M word lines, (N+1) column selection transistors, and (N+1) bit lines.

The M word lines may include a $1^{st}$ word line (WL1), a $2^{nd}$ word line (WL2), and an $M^{th}$ word line (WLM). The N+1 column selection transistors may include a $1^{st}$ column selection transistor M1, a $2^{nd}$ column selection transistor M2, a $3^{rd}$ column selection transistor M3, ..., an $N^{th}$ column selection transistor MN, and an $(N+1)^{th}$ column selection transistor (MN+1). Further, the source of each of the (N+1) column selection transistors may be connected to the power supply voltage VDD.

The (N+1) bit lines may include a $1^{st}$ bit line (BL1), a $2^{nd}$ bit line (BL2), a $3^{rd}$ bit line (BL3), ..., an $N^{th}$ bit line (BLN), and an $(N+1)^{th}$ bit line (BLN+1). Each of the (N+1) bit lines may be connected to the drains of the column selection transistor in the corresponding column in the (N+1) columns of the memory array. For example, the $N^{th}$ bit line (BLN) may be connected to the drain of each of the column selection transistors in the $N^{th}$ column of the memory array.

Each of the M word lines may correspond to the memory cells of each row of the M rows. For example, the first word line WL1 may correspond to memory cells in the $1^{st}$ row. Each of the (N+1) bit lines may correspond to the memory cells of each column of the (N+1) columns. For example, the first bit line BL1 may correspond to the memory cells in the $1^{st}$ column. That is, each memory cell may correspond to one word line and one bit line. The gate of the row selection transistor in a memory cell may be connected to the word line corresponding to the memory cell. The second end of the efuse of a memory cell may be connected to the bit line corresponding to the memory cell.

For example,memory cell 10 may be located at ($1^{st}$ row, $1^{st}$ column) and may correspond to the $1^{st}$ world line (WL1) and the $1^{st}$ bit line (BL1). Memory cell 10 may include a row selection transistor M0 and an efuse F0. The gate of the row selection transistor M0 may be connected to the $1^{st}$ word line (WL1), and the drain of the row selection transistor M0 may be connected to the first end of the efuse F0. The source of the row selection transistor M0 may be connected to the ground voltage GND, and the second end of the efuse F0 may be connected to the $1^{st}$ bit line (BL1).

Figure 4:
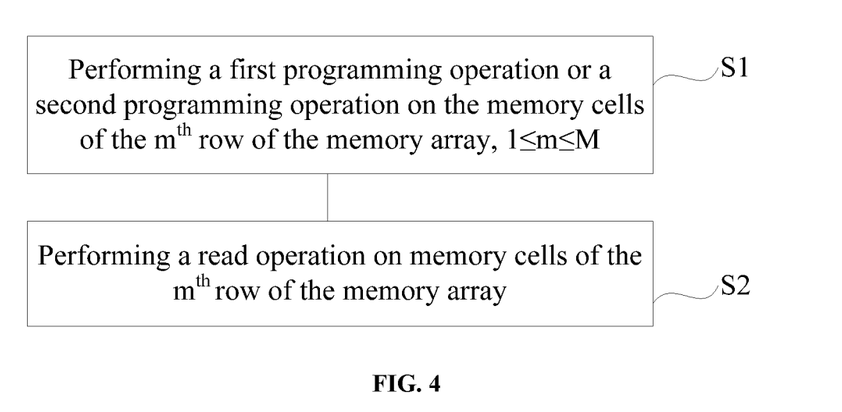
FIG. 4 illustrates a flow chart of an exemplary memory array operation consistent with disclosed embodiments.

Accordingly, the present disclosure provides a memory array operation method to operate the memory array. As shown in FIG. 4, the operation method may include the following steps.

Step S1: Performing a first programming operation or a second programming operation on the memory cells of the $m^{th}$ row of the memory array, where $1 \leq m \leq M$.

Step S2: Performing a read operation on the memory cells in the $m^{th}$ row of the memory array.

The memory cells in Step S1 and Step S2 may refer to memory cells ranging from ($1^{st}$ row, $1^{st}$ column) to ($M^{th}$ row, $N^{th}$ column) in the memory array.

Figure 5:
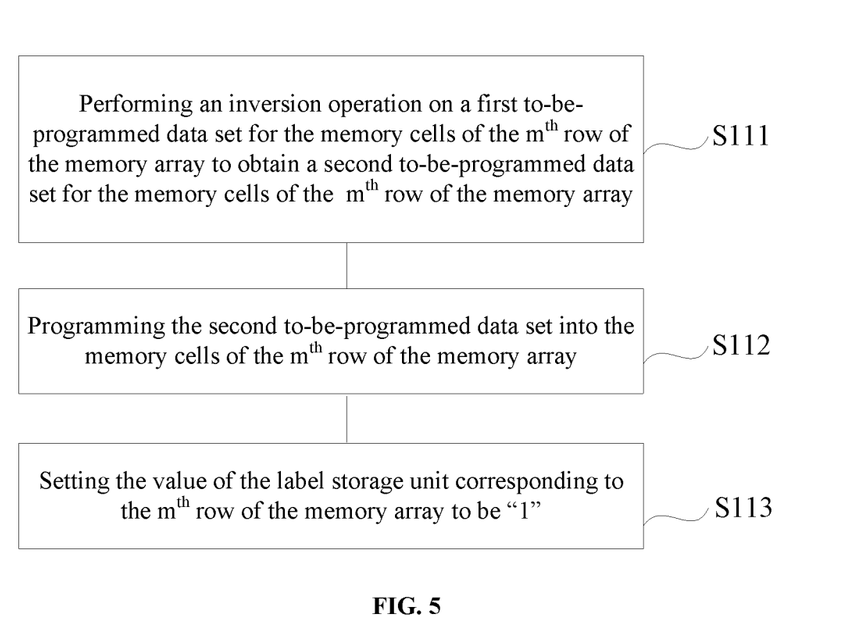
FIG. 5 illustrates a flow chart of an exemplary programming operation consistent with disclosed embodiments.

As shown in FIG. 5, the first programming operation performed on the memory cells of the $m^{th}$ row of the memory array in Step S1 may include the following steps.

Step S111: Performing an inversion operation on a first to-be-programmed data set for the memory cells of the $m^{th}$ row of the memory array to obtain a second to-be-programmed data set for the memory cells of the $m^{th}$ row of the memory array.

Step S112: Programming the second to-be-programmed data set into the memory cells of the $m^{th}$ row of the memory array. That is, the second to-be-programmed data set can be programmed into the $m^{th}$ row of memory cells.

Step S113: Setting the labeling value of the label storage unit corresponding to the $m^{th}$ row of the memory array to be "1".

The first to-be-programmed data set for the memory cells of the $m^{th}$ row of the memory array may be the original data to be programmed into the memory cells of the $m^{th}$ row of the memory array. Each memory cell of the $m^{th}$ row of the memory array may correspond to one bit of data in the first to-be-programmed data set. The inversion operation performed on the first to-be-programmed data set for the memory cells of the $m^{th}$ row of the memory array may refer to: performing an invert operation on each of the N bits of data from the data for the memory cell at ($m^{th}$ row, $1^{st}$ column) to the data for the memory cell at ($m^{th}$ row, $N^{th}$ column) in the first to-be-programmed data set. The labeling data may be stored in the label storage unit corresponding to the $m^{th}$ row of the memory array.

Figure 6:
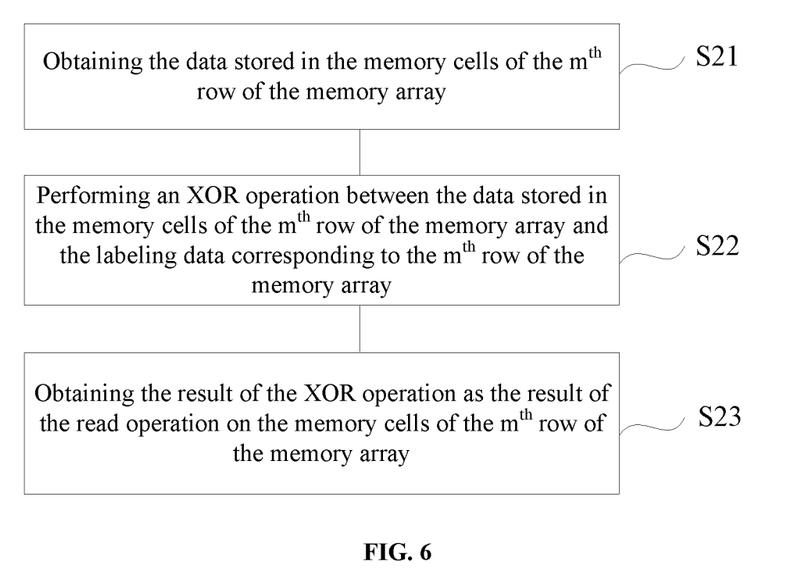
FIG. 6 illustrates a flow chart of an exemplary reading operation consistent with disclosed embodiments.

Further, as shown in FIG. 6, the reading method in Step S2 may include the following steps.

Step S21: Obtaining the data stored in the memory cells of the $m^{th}$ row of the memory array.

Step S22: Performing an XOR operation between the data stored in the memory cells of the $m^{th}$ row of the memory array and the labeling data corresponding to the $m^{th}$ row of the memory array.

Step S23: Obtaining the result of the XOR operation as the result of he read operation on the memory cells of the $m^{th}$ row of the memory array.

Step S21 may be performed by the data obtaining units. Step S22 and step S23 may be performed by using the XOR calculators.

The first programming operation performed on the memory cells of the $m^{th}$ row of the memory array can be performed under the following condition: the programming operation fails when programming a bit of the first to-be-programmed data set into the memory cell located at ($m^{th}$ row, $n^{th}$ column) of the memory array, where $1 \leq n \leq N$.

When programming a memory cell, data "1" or "0" may be programmed into the memory cell. When the bit of the first to-be-programmed data to be programmed is "1", a write operation is needed to be performed on the memory cell. A failure in a programming operation of the present disclosure may be a failure during a write operation. Data "1" or "0" may be binary or hexadecimal.

Figure 7:
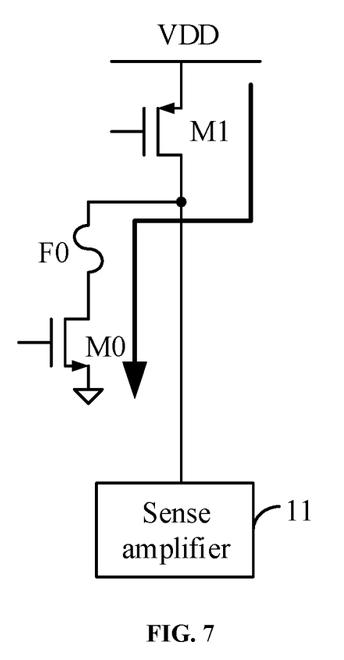
FIG. 7 illustrates an exemplary programming operation consistent with disclosed embodiments.

Returning to FIG. 3 and FIG. 7, when performing a write operation on the memory cell 10 located at ($1^{st}$ row, $1^{st}$ column) of the memory array, a high voltage may be applied on the $1^{st}$ word line (WL1) and the gate of the $1^{st}$ column selection transistor M1 such that the row selection transistor M0 and the column transistor M1 may both be on. Electrical current may flow from the source of the column selection transitory M1 through the efuse F0 to the source of the row selection transistor M0. If the current flowing time is sufficiently long and the current intensity is sufficiently high, the efuse F0 can be melted, and data "1" may be written into the memory cell 10. When the bit of data to be programmed is "0", a write operation may not be needed to be performed on memory cell such that the efuse of the memory cell may not be melted and "0" may be programmed into the memory cell. In practice, the efuse may not really be melted after a write operation but the resistance of the efuse may still multiply significantly after the melting process. A "melted efuse" here can often stand for an efuse when the resistance of the efuse multiplies significantly after a write operation/melting process. In one embodiment, an efuse with a resistance higher than the threshold resistance may be considered a melted efuse. The threshold resistance can be determined according to actual situations.

Figure 8:
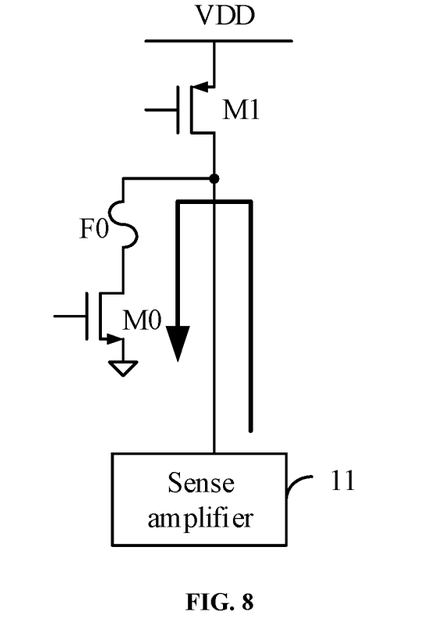
FIG. 8 illustrates an exemplary read operation consistent with disclosed embodiments.

Returning to FIG. 3 and FIG. 8, when performing a read operation on the memory cell 10 located at ($1^{st}$ row, $1^{st}$ column) of the memory array, a high voltage may be applied on the $1^{st}$ word line (WL1), and a low voltage may be applied on the gate of the $1^{st}$ column selection transistor M1 such that the row selection transistor M0 may be turned on and the column selection transistor M1 may be turned off. The $1^{st}$ sense amplifier 11 connected to the second end of the efuse F0 may generate electrical current. The electrical current may flow through the efuse F0 to the source of the row selection transistor M0. The $1^{st}$ sense amplifier 11 may detect the voltage at the second end of the efuse F0 to determine the resistance of the efuse F0. The data stored in the memory cell 10 may be obtained based on the resistance of the efuse F0. When the resistance of the efuse F0 is higher than the threshold resistance, the data stored in the memory cell 10 may be obtained as "1". When the resistance of the efuse F0 is lower than or equal to the threshold resistance, the data stored in the memory cell 10 may be obtained as "0".

From the above programming process and read operation, it can be seen that, when the current flowing time through the efuse is not sufficiently long or the current intensity is not sufficiently high, the efuse may not be melted and the data obtained by the read operation may be erroneous. Thus, a write operation fails.

The bit of first to-be-programmed data for the memory cell located at ($m^{th}$ row, $n^{th}$ column) where the write operation fails may be the first bit of data required a write operation in the first to-be-programmed data set for the memory cells in the $m^{th}$ row of the memory array. For example, the memory cell located at ($1^{st}$ row $1^{st}$ column) may correspond to a bit of "0" in the first to-be-programmed data set, the memory cell located at ($1^{st}$ row, $2^{nd}$ column) may correspond to a bit of "1" in the first to-be-programmed data set, the memory cell located at ($1^{st}$ row, $3^{rd}$ column) may correspond to a bit of "0" in the first to-be-programmed data set, and the memory cell located at ($1^{st}$ row, $4^{th}$ column) may correspond to a bit of "0" in the first to-be-programmed data set. The data "1" for the memory cell located at ($1^{st}$ row, $2^{nd}$ column) may be the first bit of data required a write operation. When the write operation on the memory cell located at ($1^{st}$ row, $2^{nd}$ column) fails, the first programming operation may be performed on the memory cells of the $m^{th}$ row of the memory array.

To test whether each bit of data is programmed successfully, a read operation may be performed on each bit of data after the bit of data is programmed into the corresponding memory cell. That is, after performing a programming operation to a memory cell, a read operation may be performed on the memory cell to test whether the programming operation on the memory cell is successful.

The above steps are further illustrated in light of the following embodiments. For example, memory cells located from ($1^{st}$ row, $1^{st}$ column) to ($1^{st}$ row, $8^{th}$ column) in a memory array may be data storage units and the memory cell located at ($1^{st}$ row, $9^{th}$ column) may be a label storage unit. The original data set to be programmed into the memory cells located from ($1^{st}$ row, $1^{st}$ column) to ($1^{st}$ row, $8^{th}$ column) may be "01001000". That is, the first to-be-programmed data set for the memory cells of the $1^{st}$ row of the memory array may be "01001000".

A programming operation may be performed to consecutively program each bit of the first to-be-programmed data set, "01001000", into each of the memory cells located from ($1^{st}$ row, $1^{st}$ column) to ($1^{st}$ row, $8^{th}$ column). In practice, a write operation may only need to be performed on the data memory cells located at ($1^{st}$ row, $2^{nd}$ column) and ($1^{st}$ row, $5^{th}$ column). For example, assuming a read operation is performed after a write operation is performed on the memory cell at ($1^{st}$ row, $2^{nd}$ column), and the data obtained by the read operation shows the data stored in the memory cell at ($1^{st}$ row, $2^{nd}$ column) is "0". That is, the efuse of the memory cell at $1^{st}$ row, $2^{nd}$ column) is not melted by the write operation. The following steps may be further performed.

Performing an inversion operation on the first to-be-programmed data set "01001000" to obtain the second to-be-programmed data set "10110111" for the memory cells of the $1^{st}$ row of the memory array; programming the second to-be-programmed data set "10110111" into the memory cells of the $1^{st}$ row of the memory array; and programming the labeling data "1" into the label storage unit located in the memory cell at ($1^{st}$ row, $9^{th}$ column).

When programming the second to-be-programmed data set "10110111" into the memory cells of the $1^{st}$ row of the memory array, a write operation may be performed only on the memory cells located at ($1^{st}$ row, $1^{st}$ column), ($1^{st}$ row, $3^{rd}$ column), ($1^{st}$ row, $4^{th}$ column), ($1^{st}$ row, $6^{th}$ column), ($1^{st}$ row, $7^{th}$ column), ($1^{st}$ row, $8^{th}$ column), and the label storage unit located at ($1^{st}$ row, $9^{th}$ column).

When a read operation is performed on the memory cells of the $1^{st}$ row of the memory array, the following steps can be performed.

The data "10110111" stored in the $1^{st}$ row of the memory array can be obtained; an XOR operation may be performed between the programmed data "10110111" and the labeling data "1" for the $1^{st}$ row of the memory array; and the result of the XOR operation of "01001000" can be obtained as the result of the read operation on the memory cells of the $1^{st}$ row of the memory array.

As can be seen from the above embodiment, though programming failures may occur when programming the first to-be programmed data set into the memory cells of the $1^{st}$ row of the memory array, the result of the read operation after the first programming operation according to the embodiment can still be accurate. Thus, production yield of the memory device can be improved.

The first programming operation performed on the memory cells of the $m^{th}$ row of the memory array can also be performed when the following condition is satisfied: the number of data required a write operation in the first to-be-programmed data set for the $m^{th}$ row of the memory array exceeds half of the total number of the data in the first to-be-programmed data set.

When more memory cells need to be written, programming failures are more likely to occur during the programming process. When the number of the data "1" in the first to-be-programmed data set exceeds half the total number of the data in the first to-be-programmed data set, the first programming operation provided by the embodiment may be performed. That is, the programming operation is performed after an inversion operation is performed on the first to-be-programmed data set. The inversion operation may reduce the number of memory cells required to be written using the write operation. Thus, the probability of having a programming failure may be reduced, and the production yield of the memory device may be improved. For example, the first to-be-programmed data set can be "11111000". Based on the first to-be-programmed data set, five "1"s may need to be written into memory cells. If the first programming operation disclosed in the embodiment is performed, only four write operations may be needed including three to be written into memory cells and one to be written into the label storage unit, and the result of the corresponding read operation can be accurate.

Figure 9:
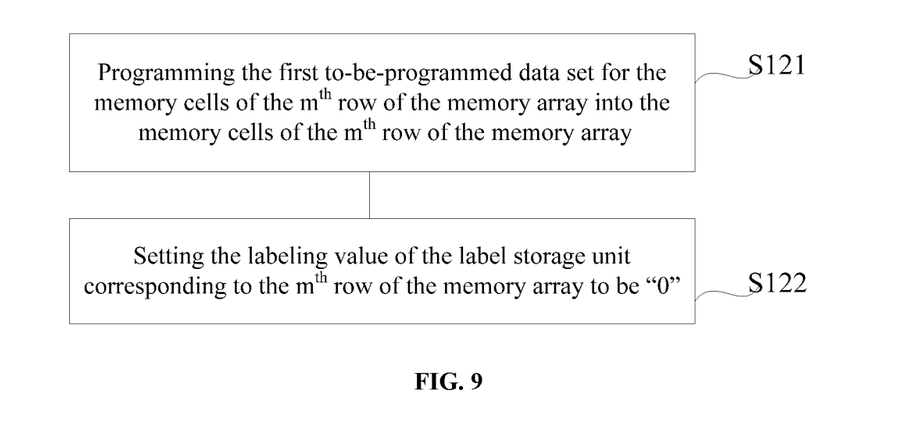
FIG. 9 illustrates a flow chart of another exemplary programming operation consistent with disclosed embodiments.

As shown in FIG. 9, the second programming operation performed on the memory cells of the $m^{th}$ row of the memory array in Step S1 (FIG. 4) may include the following steps.

Step S121: Programming the first to-be-programmed data set for the memory cells of the $m^{th}$ row of the memory array into the $m^{th}$ row of the memory array.

Step S122: Setting the labeling value of the label storage unit corresponding to the $m^{th}$ row of the memory array to be "0".

When programming the first to-be-programmed data set into the memory cells of the $m^{th}$ row of the memory array is successful, the value of the labeling storage unit may be set to be "0". Thus, when a read operation is performed, the XOR operation may be performed between the first to-be-programmed data set and the value of the label storage unit. The result of the XOR operation may still be the first to-be-programmed data set, and the accuracy of the result of the reading operation can be ensured.

In certain embodiments, even if an inversion is not necessary to program the first to-be-programmed data set into the $m^{th}$ row of memory cells, e.g., the number of "1"s in the first to-be-programmed data set is less than half of the total number of bits in the first to-be-programmed data set, an inversion may still be performed to ensure the result of the read operation on the $m^{th}$ row is accurate.

For example, if programming failure occurs when the first bit of the first to-be-programmed data set is programmed into the corresponding memory cell of the $m^{th}$ row of the memory array, the circuit can also reverse the programming value to make sure circuit to work. That is, the inversion can be performed to repair the programming error when programming the first programming bit.

For example, assuming the first to-be-programmed data set is "10001000" for the memory cells ranging from ($m^{th}$ row, $1^{st}$ column) to ($m^{th}$ row, $8^{th}$ column). The label storage unit can be located at ($m^{th}$ row, $9^{th}$ column). The memory cells required a write operation can be the memory cells located at ($m^{th}$ row, $1^{st}$ column) and ($m^{th}$ row, $5^{th}$ column) of the memory array. Since the number of "1"s in the first to-be-programmed data set is 2, less than half of the total number of bits, i.e., 4, of the first to-be-programmed data set, an inversion may not be necessary to program the first to-be-programmed data set into corresponding memory cells in the $m^{th}$ row. However, if the write operation to write the first "1" into the memory cell located at ($m^{th}$ row, $1^{st}$ column) fails, an inversion can be performed to ensure the result of the read operation on the $m^{th}$ row is accurate. That is, if a read operation is performed after the memory cell at ($m^{th}$ row, $1^{st}$ column) is written and the result of the read operation returns a "0", programming failure has occurred when programming the memory cell located at ($m^{th}$ row, $1^{st}$ column) of the memory array. Then, an inversion can be performed to invert the rest bits of data in the first to-be-programmed data set to be "1110111" for memory cells ranging from ($m^{th}$ row, $2^{nd}$ column) to ($m^{th}$ row, $8^{th}$ column). In other words, the data set "1110111" can be programmed into memory cells ranging from ($m^{th}$ row, $2^{nd}$ column) to ($m^{th}$ row, $8^{th}$ column), and the labeling value of the label storage unit can be programmed to be "1".

Specifically, when a read operation is performed on the memory cells of the $m^{th}$ row of the memory array, the following steps can be performed.

The data "01110111" stored in the $m^{th}$ row of the memory array can be obtained; an XOR operation may be performed between the programmed data "01110111" and the labeling data "1" for the $m^{th}$ row of the memory array; and the result of the XOR operation of "10001000" can be obtained as the result of the read operation on the $m^{th}$ row of the memory array. The result of the XOR operation may still be the first to-be-programmed data set, and the accuracy of the result of the reading operation can be ensured.

Figure 10:
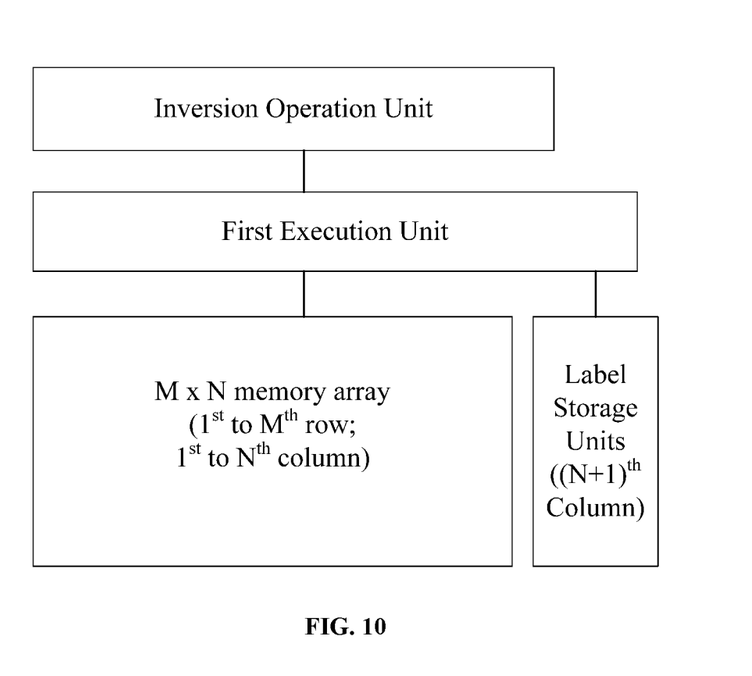
FIG. 10 illustrates a block diagram of an exemplary memory array with an inversion operation unit and a first execution unit consistent with disclosed embodiments.

It should be noted that the memory cells, and ways of connections between a memory cell and the corresponding word lines, a memory cell and the corresponding column selection transistor, and a memory cell and the corresponding bit line in the disclosure are only exemplary embodiments of the memory cells. The memory cells may also be realized using other types of structures or configurations. Thus, the structures or configurations of the memory cells should not limit the scope of this disclosure. According to the operation method for the memory array illustrated above, the memory device may further include a first programming operation unit. The first programming operation unit may include an inversion operation unit and a first execution unit. FIG. 10 illustrates a memory array according to FIG. 3 and the corresponding inversion operation unit and first execution unit. For example, the inversion operation unit may be connected to the first execution unit. Further, the first execution unit may be connected to the M rows by N columns data storage units and the label storage units of the memory array. The label storage units may be located in the $(N+1)^{th}$ column of the memory array.

The inversion operation unit may be configured to perform the inversion operation on the first to-be-programmed data set for the memory cells of the $m^{th}$ row of the memory array to obtain the second to-be-programmed data set for the memory cells of the $m^{th}$ row of the memory array.

The first execution unit may be configured to perform a programming operation such that the second to-be-programmed data set for memory cells of the moth row of the memory array can be programmed into the $m^{th}$ row of the memory array, and data "1" can be programmed into the label storage unit corresponding to the $m^{th}$ row of the memory array.

The memory device may further include a first triggering unit configured to trigger the first programming operation unit when the programming a bit of the first to-be-programmed data set for the memory cell at ($m^{th}$ row, $n^{th}$ column) into the memory cell at ($m^{th}$ row, $n^{th}$ column) fails, where 1≤n≤N. The bit of the first to-be-programmed data for the memory cell at ($m^{th}$ row, $n^{th}$ column) may be the first bit of data required a write operation in the first to-be-programmed data set for the $m^{th}$ row of the memory array. The data required a write operation may be "1".

The memory device may further include a second triggering unit, configured to trigger the first programming operation unit when the number of data required a write operation in the first to-be-programmed data set for the $m^{th}$ row of the memory array exceeds half of the total number of bits of data in the first to-be-programmed data set for the $m^{th}$ row of the memory array.

TABLE 1

| Number of "1" in the first to-be-programmed data set | Number of "1" to be written in existing efuse memory device | Number of "1" to be written in disclosed efuse memory device |
|---|---|---|
| 1-bit | 1 | 1 |
| 2-bit | 2 | 2 |
| 3-bit | 3 | 3 |
| 4-bit | 4 | 4 |
| 5-bit | 5 | 3 + 1 |
| 6-bit | 6 | 2 + 1 |
| 7-bit | 7 | 1 + 1 |
| 8-bit | 8 | 0 + 1 |

For example, Table 1 may show a comparison of the number of "1"s required to be written in an existing memory device and the disclosed memory device. In one embodiment, the first to-be-programmed data set, having 8 bits of data, is to be programmed into a row of memory cells.

As shown in Table 1, a comparison of number of "1"s required to be written into corresponding memory cells in the existing efuse memory device and in the disclosed memory device is listed.

Using an existing efuse memory device and its corresponding operation method, the number of bits of data required to be written may be equal to the number of "1"s. That is, when the first to-be-programmed data set contains one bit of "1" and seven bits of "0"s, one rite operation is required to program the "1" into the corresponding memory cell. Similarly, when the first to-be-programmed data set contains five bits of "1"s and three bits of "0"s, five write operations are required to program the "1"s into corresponding memory cells.

However, by using the disclosed memory device and the corresponding operation method, when the number of bits of data required to be written exceeds half of the total number of bits of data in the first to-be-programmed data set, an inversion operation can be performed on the first to-be-programmed data set, and the number of "1"s required to be written may be equal to the number of the original "0"s in the first to-be-programmed data set in addition to one "1" to be programmed into the corresponding label storage unit.

That is, when the 8 bits of data set contains one bit of "1" and seven bits of "0"s, one write operation is required to program the "1" into the corresponding memory cell by using the disclosed memory device and the corresponding operation method. When the 8 bits of data set contains five bits of "1"s and three bits of "0"s, only four rite operations are required, including three write operations to program the "1"s into corresponding memory cells and one write operation to program a "1" into the corresponding label storage unit. That is, when the number of bits of data required to be written exceeds half of the total number of bits of data in the first to-be-programmed data set, the number of bits of data to be programmed into corresponding memory cells can be reduced as the number of "1"s increases. The time for programming and probability of programming failure can be effectively reduced.

Further, in Table 2, the probability of 1 programming failure and production yield of the existing efuse memory device operated by its corresponding operation method may be compared to the probability of 1 programming failure and production yield of the disclosed efuse memory device operated by the corresponding operation method.

TABLE 2

| Number of "1"s in the first to-be-programmed data set | Probability of having 1 programming failure in existing/disclosed memory device | Production yield in existing memory device | Production yield in proposed memory device |
| --- | --- | --- | --- |
| 1 bit | 10 ppm/0 ppm | 100 $ppm^2$ | 800 $ppm^2$ |
| 2 bits | 20 ppm/10 ppm | 400 $ppm^2$ | 1400 $ppm^2$ |
| 3 bits | 30 ppm/20 ppm | 900 $ppm^2$ | 1800 $ppm^2$ |
| 4 bits | 40 ppm/30 ppm | 1600 $ppm^2$ | 2000 $ppm^2$ |
| 5 bits | 50 ppm/30 ppm | 2500 $ppm^2$ | 2000 $ppm^2$ |
| 6 bits | 60 ppm/20 ppm | 3600 $ppm^2$ | 1800 $ppm^2$ |
| 7 bits | 70 ppm/10 ppm | 4900 $ppm^2$ | 1400 $ppm^2$ |
| 8 bits | 80 ppm/0 ppm | 6400 $ppm^2$ | 800 $ppm^2$ |
| Average | 45 ppm/15 ppm | 2550 $ppm^2$ | 1500 $ppm^2$ |

For example, the first to-be-programs ed data set may include 8 bits of data to be programmed into a row of memory cells. As shown in Table 2, a comparison of probability of having 1 programming failure and production yield between the existing efuse memory device and the disclosed efuse memory device is listed. Ppm (parts per million) may represent the probability of having 1 programming failure, and $ppm^2$ may represent production yield. A lower $ppm^2$ value may stand for a higher production yield. It can be seen that by using the disclosed efuse memory device, the probability of having a programming failure decreases as the number of "1" exceeds half of the total number of bits of data to be programmed compared to using the existing efuse memory device.

Accordingly, compared to the existing efuse memory device, the production yield of the disclosed efuse memory device operated using the disclosed operation method can increase significantly as the number of "1" exceeds half of the total number of bits of data in the first to-be-programmed data set. In addition, the disclosed efuse memory device may have a lower average probability of having 1 programming failure and a significantly higher average production yield compared to the existing efuse memory device. Worst case scenario, if the first to-be-programmed data set includes 1000 bits of "1"s, the probability of having 1 programming failure in an existing efuse memory device may be 10200 ppm. However, by using the proposed memory device and operation method, the probability of having 1 programming failure may only be 1024 ppm, significantly lower than the existing efuse memory device.

The memory may further include a second execution unit configured to program the first to-be-programmed data set for the memory cells of the $m^{th}$ row of the memory array into the memory cells of the $m^{th}$ row of the memory array, and program the label storage unit corresponding to the $m^{th}$ row of the memory array to be "0".

The detailed realization methods of the first programming operation unit, the first triggering unit, and the second execution unit are well known to those skilled in the art, and thus, are omitted herein.

Compared to the existing efuse memory device, the presently disclosed efuse memory device can have improved production yield for the following reasons.

When the number of bits of data required a write operation in the first to-be-programmed data set for the $m^{th}$ row of the memory array exceeds half of the total number of bits of data in the first to-be-programmed data set for the $m^{th}$ row of the memory array, the first programming operation is performed to invert the first to-be-programmed data set and program "1" to the label storage unit corresponding to the $m^{th}$ row of the memory array. The number of data required a write operation can be reduced and production yield of the memory device can be improved indirectly.

When the label storage unit is damaged and not suitable for the write operation, other efuse memory cells, e.g. data storage units, can still be written without being inverted.

Even if no inversion is needed for the write operation, in case a first memory cell is not able to be written, data for other efuse memory cells can still be inverted and written into the memory cells.

Therefore, a suitable logic control unit/function can be used to monitor the above conditions and adjust accordingly to improve yield production of the disclosed efuse memory device.

Embodiments consistent with the current disclosure provide memory and operation method for memory arrays. Other applications, advantages, alternations, modifications, or equivalents to the disclosed embodiments are obvious to those skilled in the art. It is intended that the specification and examples be considered as exemplary only, with a true scope and spirit of the invention being indicated by the claims.

What is claimed is:

1. A method for operating a memory having an array of memory cells arranged in a plurality of rows and a plurality of columns, each row of memory cells including a label storage unit storing a labeling value, the method comprising:

receiving a first to-be-programmed data set to be stored into a target row of memory cells;
determining whether at least one programming condition on the target row of memory cells is satisfied;
when it is determined that the at least one programming condition on the target row of memory cells is satisfied, performing a first operation on the first to-be-programmed data set to obtain a second to-be-programmed data set, programming the second to-be-programmed data set into the target row of memory cells, and setting a value of the label storage unit corresponding to the target row of memory cells to be a first labeling value; and
when it is determined that the at least one programming condition on the target row of memory cells is not satisfied, performing a second operation on the first to-be-programmed data set to program the first to-be-programmed data set into the target row of memory cells, and setting the value of the label storage unit corresponding to the target row of memory cells to be a second labeling value,
when one memory cell in the target row of memory cells fails to be written, one or more remaining memory cells in the same target row of memory cells are able to be written without being inverted;
wherein the plurality of columns of memory cells include N number of columns of data memory cells and one column of label memory cells, each column of data memory cells are connected to a first input end of a corresponding XOR calculator, and a second input end of each XOR calculator is connected to the column of label memory cells.

2. The method according to claim 1, further including:
after the first to-be-programmed data set or the second to-be-programmed data set is programmed into the target row of memory cells, obtaining an output data set from the target row of memory cells; and
performing a read operation including a third operation between the output data set and the labeling value of the label storage unit to generate a retrieval data set from the target row of memory cells.

3. The method according to claim 2, wherein the third operation is an XOR operation.

4. The method according to claim 2, wherein the retrieval data set is a result of the read operation.

5. The method according to claim 1, wherein the first operation includes an inversion operation, and the second operation includes a write operation.

6. The method according to claim 1, wherein the first labeling value is "1"; and the second labeling value is "0".

7. The method according to claim 1, wherein the at least one programming condition includes:
a programming failure occurs when a first to-be-programmed data set for the target row of memory cells is programmed into the target row of memory cells.

8. The method according to claim 7, wherein:
the programming failure occurs in a first memory cell requiring a write operation in the first to-be-programmed data set.

9. The method according to claim 1, wherein the at least one programming condition on the target row of memory cells includes a condition when a number of bits of data requiring a write operation in the first to-be-programmed data set exceeds half of a total number of bits of data in the first to-be-programmed data set.

10. The method according to claim 8, wherein:
the data requiring the write operation is "1".

11. The method according to claim 7, wherein the programming failure includes a failure for programing a data bit that requires a first write operation in the first to-be-programmed data set for the target row of memory cells.

12. The method according to claim 1, wherein the first to-be-programmed data set includes original data to be programmed into the memory cells of the target row of the memory cells.

13. The method according to claim 1, wherein each memory cell in the target row of the memory cells corresponds to one bit of data in the first to-be-programmed data set.

14. A memory device, comprising:
a memory for storing M×N bits of data, wherein M and N are integers greater than 1, having an array of M rows by (N+1) columns of memory cells, (N+1) number of data obtaining units, and N number of XOR calculators, wherein:
each memory cell of $(N+1)^{th}$ column of each row label storage unit for storing a labeling value;
each data obtaining unit is connected to a corresponding column of memory cells to obtain data stored in the memory cells in the corresponding column;
a first input end of each XOR calculator is connected to an output end of a corresponding data obtaining unit connected to a corresponding column of memory cells, and a second input end of each XOR calculator is connected to an output end of a data obtaining unit connected to the $(N+1)^{th}$ column of memory cells; and
a control unit is configured such that, when one memory cell in any row of memory cells fails to be written, one or more remaining memory cells in the same row of memory cells are able to be written without being inverted.

15. The memory device according to claim 14, further including:
an inversion operation unit configured to perform an inversion operation on a first to-be-programmed data set for a target row of memory cells to obtain a second to-be-programmed data set for the target row of memory cells; and
a first execution unit configured to program the second to-be-programmed data set into the target row of memory cells, and program "1" into a label storage unit corresponding to the target row of memory cells.

16. The memory device according to claim 15, further including:
a first triggering unit to trigger the inversion operation unit and the first execution unit when a programming failure occurs, wherein the programming failure refers to a failure to program the first to-be-programmed data set into the target row of memory cells.

17. The memory device according to claim 16, wherein:
the programming failure occurs in a first memory cell requiring a write operation in the first to-be-programmed data set.

18. The memory device according to claim 17, further including:
a second triggering unit to trigger the inversion operation unit and the first execution unit when a number of bits of data requiring a write operation in the first to-be-programmed data set exceeds half of a total number of bits of data in the first to-be-programmed data set.

19. The memory device according to claim 17, wherein:
the data requiring the write operation is "1".

20. The memory device according to claim 15, further including:
  a second execution unit to program the first to-be-programmed data set into the target row of memory cells, and program a "0" into the label storage unit corresponding to the target row of memory cells.

\* \* \* \* \*